(12) United States Patent
Flynn et al.

(10) Patent No.: US 10,587,286 B1
(45) Date of Patent: Mar. 10, 2020

(54) METHODS AND DEVICES FOR HANDLING EQUIPROBABLE SYMBOLS IN ENTROPY CODING

(71) Applicants: BlackBerry Limited, Waterloo (CA); 2236008 Ontario Inc., Waterloo (CA)

(72) Inventors: David Flynn, Darmstadt (DE); Sébastien Lasserre, Thorigné-Fouillard (FR)

(73) Assignees: BlackBerry Limited, Waterloo, Ontario (CA); 2236008 Ontario Inc., Waterloo, Ontario (CA)

( * ) Notice: Subject to any disclaimer, the term of this patent is extended or adjusted under 35 U.S.C. 154(b) by 0 days.

(21) Appl. No.: 16/356,087

(22) Filed: Mar. 18, 2019

(51) Int. Cl.
*H03M 7/40* (2006.01)
(52) U.S. Cl.
CPC .................. *H03M 7/4006* (2013.01)
(58) Field of Classification Search
USPC ...................... 341/50, 65, 67, 107
See application file for complete search history.

(56) References Cited

U.S. PATENT DOCUMENTS

| | | | |
|---|---|---|---|
| 2013/0187798 A1* | 7/2013 | Marpe | H03M 7/4081 341/67 |
| 2014/0210652 A1* | 7/2014 | Bartnik | H03M 7/40 341/67 |
| 2016/0050427 A1* | 2/2016 | Berry | H04N 19/13 375/240.25 |

* cited by examiner

*Primary Examiner* — Howard Williams
(74) *Attorney, Agent, or Firm* — Rowand LLP

(57) ABSTRACT

Methods of encoding and decoding data in which some data symbols are entropy coded and some data symbols are bypass coded. The encoder separates the coded symbols into an entropy coded stream and a bypass coded stream. The streams are packaged in a data unit that has a payload structured to contain one of the streams in forward order and the other stream in reverse order, with the reverse order stream aligned with the end of the data unit. In this manner, at the decoder, the decoder may begin decoding the forward order stream from its beginning and may also begin decoding the reverse order stream from its beginning at the end of the data unit by extracting symbols in reverse order. The data unit does not need to signal the length of the streams. The decoder determines the length of the data unit from explicit or implicit signaling.

20 Claims, 7 Drawing Sheets

METHODS AND DEVICES FOR HANDLING EQUIPROBABLE SYMBOLS IN ENTROPY CODING

FIELD

The present application generally relates to data compression and, in one particular example, entropy coding of symbols. The present application describes methods and devices for handling equiprobable symbols in entropy coding systems.

BACKGROUND

Data compression is used in communications and computer networking to store, transmit, and reproduce information efficiently. Data is generally in the form of symbols drawn from an alphabet. The alphabet may be binary in some examples but may be non-binary in many other examples.

Entropy coding is often used to encode a series or sequence of symbols in a manner that requires fewer bits than would otherwise be required to represent the series or sequence. Entropy coding may be context adaptive entropy coding in some cases. Example entropy encoding processes include Variable Length Codes such as Huffman codes, Arithmetic coding, and others.

Alphabets consisting of equiprobable symbols cannot be compressed. It is therefore undesirable to use an arithmetic coder or other complex entropy coder to convey equiprobable symbols. However, for reasons of system design, it is often desirable to interleave both ordinary and equiprobable symbols while using a single entropy coder.

It would be advantageous to provide encoders and decoders capable of efficiently handling both entropy coded and equiprobable symbols.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
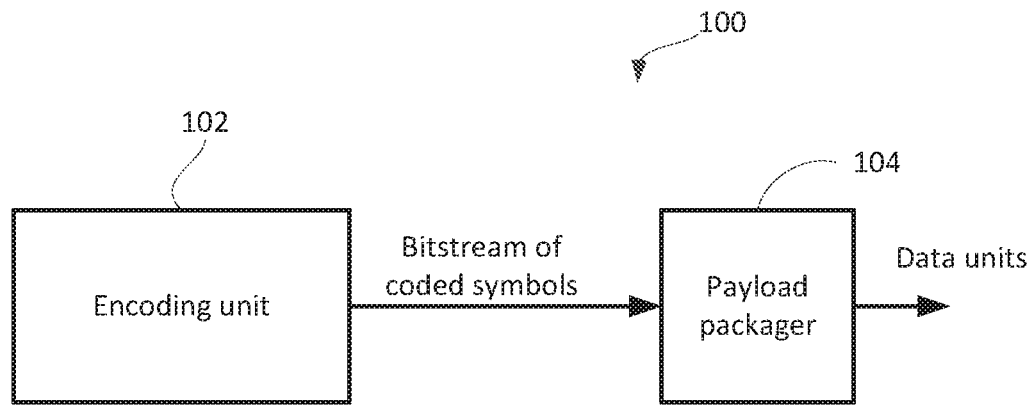
FIG. 1 shows an example of an entropy coder using both entropy coding and bypass coding.

The present application describes methods and devices for encoding and decoding entropy-coded data together with bypass coded data, where bypass coded data may include the non-entropy-coding of equiprobable symbols. The methods and devices may include packaging streams of entropy coded and bypass coded data together in a payload in a such a manner as to avoid the cost of having to signal the length of the individual streams.

In one aspect, the present application describes a method of decoding a data unit to reconstruct encoded data. The method may include receiving the data unit, which includes a preamble followed by a payload, the payload including a forward order bitstream followed by a reverse order bitstream; determining a length of the data unit; in response to a request for a symbol from a decoding unit, selectively reading data from either the forward order bitstream in a forward order or the reverse order bitstream in a reverse order; and decoding the data in the decoding unit to reconstruct the symbol. One of the forward order bitstream and the reverse order bitstream includes entropy encoded symbols and the other of the forward order bitstream and the reverse order bitstream includes bypass coded symbols.

In another aspect, the present application describes a method of transmitting encoded data, where the encoded data includes a first bitstream of entropy encoded symbols and a second bitstream of bypass coded symbols. The method may include buffering the first bitstream and the second bitstream; reversing one of the first bitstream and the second bitstream to create a reverse order bitstream, wherein the other of the first bitstream and the second bitstream is a forward order bitstream; generating a data unit that includes a preamble followed by the forward order bitstream, which is followed by the reverse order bitstream; and outputting the data unit.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

Any feature described in relation to one aspect or embodiment of the invention may also be used in respect of one or more other aspects/embodiments. These and other aspects of the present invention will be apparent from, and elucidated with reference to, the embodiments described herein.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

Reference is first made to FIG. 1, which shows a block diagram of an example encoder 100. The encoder 100 includes an encoding unit 102 that converts the source data to a bitstream of encoded symbols. The source data may include any data subject to compression in accordance with a compression scheme. Non-limiting examples include image data, audio data, video data, point cloud data, and other types of data. The bitstream output from the encoding unit 102 may include some symbols coded using entropy coding and some symbols that have been bypass coded.

A payload packager 104 receives the bitstream and packages the bitstream for storage or transmission. In some cases, this includes breaking the bitstream into portions and packetizing the portions such that each data unit includes a preamble and a payload having a portion of the bitstream. The data units are then output for storage or transmission.

In some instances, an entropy coder, such as an arithmetic coder, may be adapted to handle equiprobable symbols. For example, in a binary arithmetic coder the subdivision of the interval may be simplified (such as implementing multiplication as a bit shift). However, there is still computation required to update the codec state and to determine (at a decoder) the decoded symbol value. This optimization may be exploited in the design of a compression system by designating certain symbols to use a static p=0.5 probability model with the designated symbols being called bypass coded. The H. 264|AVC and H. 265|HEVC video compression systems both employ this sort of approach.

In an alternative implementation, the symbol stream may be split into two sub-streams. The first stream consists of non-bypass coded symbols that are arithmetically coded resulting in a so-called Arithmetic Entropy Coded (AEC) stream, and the second stream is a sequence of uncompressed bypass coded symbols. To package and transmit the two separate streams, a length field is used to indicate the length L of the first coded sub-stream, which then allows a decoder to simultaneously access both streams which it needs to do to be able to re-multiplex the symbols in proper sequence during the decoding. This approach results in diminished compression efficiency due to the additional signaling of the length field while also requiring that a decoder buffer the entirety of the L length first sub-stream in order to access the start (at position L+1) of the second sub-stream.

In one aspect, the present application provides methods of coding symbols that enable parallel decoding of an entropy-coding stream and a bypass-coded stream without the signaling overhead of a length field. In a system in which coded data is signaled in a data unit having a length determinable by the decoder, the payload of the data unit is structured to contain one of the streams in forward order and the other stream in reverse order, with the reverse order stream aligned with the end of the data unit. In this manner, at the decoder, the decoder may begin decoding the forward order stream from its beginning near the front of the data unit following a preamble or other metadata structure, and may also begin decoding the reverse order stream from its beginning at the end of the data unit by extracting symbols in reverse order. Notably, the decoder need not know the length of either of the streams in order to begin decoding them. It will further be appreciated that the decoder will need to buffer the entire data unit in memory in order to be able to consume it from both ends.

In one example, a reverse order pointer may start at the end of the data unit and be decremented as coded symbols are read from the reverse order stream. In another example, the data unit may be copied to memory in reverse order and a reverse stream pointer aligned with the beginning of the reversed data unit and then incremented so as to read the coded symbols of the reverse order stream in order.

Figure 2:
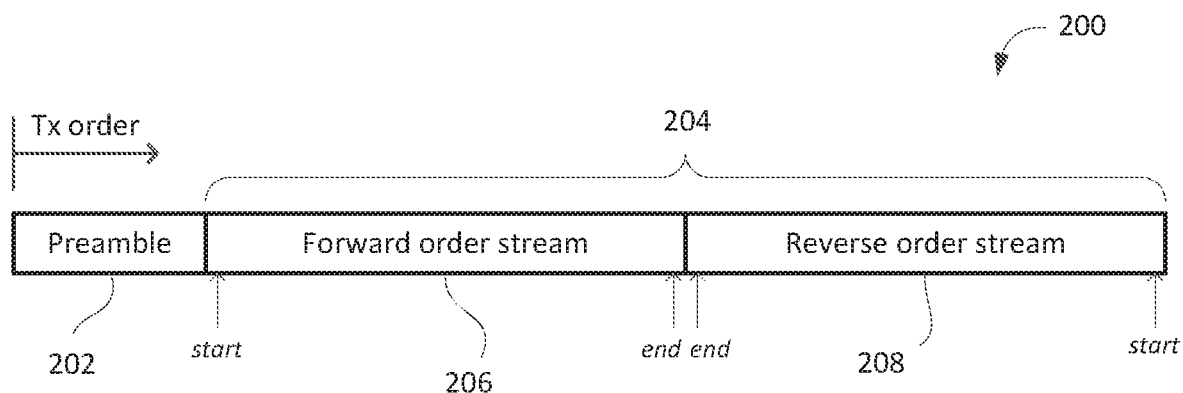
FIG. 2 diagrammatically illustrates the structure of an example data unit.

FIG. 2 diagrammatically illustrates an example data unit 200. The data unit 200 is structured to include a preamble 202 at its beginning. The preamble 202 contains header information, which in various embodiments may include metadata such as, for example, a version code, signaling flags of various types (e.g. parameters to be used by a decoding or reconstruction process), timestamps, data type codes, etc. It will be appreciated that the preamble may have a length fixed by the protocol, may have a fixed length that is signaled elsewhere in the bitstream, or may have a variable length that is determinable by the decoder, such through detection of an end code or the like. In some implementations, the preamble 202 may signal the data unit length. This may include an explicit length field or the length may be specified by way of a data unit type code or other metadata that is linked to a length value.

Following the preamble 202 in the transmission order is a payload 204. The front end of the payload 204 contains a forward order stream 206. The forward order stream 206 is aligned with the beginning of the payload 204. The payload 204 further includes a reverse order stream 208. The reverse order stream 208 is a bitstream that has been reversed and added to the payload 204 so as to align the original beginning of the bitstream prior to reversal with the end of the data unit 200.

In one example, the forward order stream 206 contains the entropy coded symbols and the reverse order stream 208 contains the bypass coded symbols. In another example, the forward order stream 206 contains the bypass coded symbols and the reverse order stream 208 contains the entropy coded symbols.

At a decoder, after reading the preamble 202, the decoder may initialize two pointers: a forward read pointer that is initialized to the beginning of the forward order stream 206, and a reverse read pointer that is initialized to the end of the data unit 200, i.e. the beginning of the reverse order stream 208. It will be understood by those ordinarily skilled in the art that the concept of initializing the reverse read pointer at the end of the data unit may mean that it is initialized to a position at the beginning of a byte, word or other unit of data, the end of which aligns with then end of the data unit 200, and not necessarily that the pointer points to the last bit of the data unit 200.

As symbols are requested for decoding and reconstruction of the data, the decoder reads a coded symbol(s) from either the forward order stream 206 or the reverse order stream 208 depending upon the symbol type requested. As symbols are read from the reverse order stream 208, the reverse read pointer is decremented.

It will be appreciated that the reverse order bitstream 208 may be generated through a bitwise reversal of an original bitstream. In some cases, the reverse order bitstream 208 may be generated through a byte-wise reversal of the original bitstream, particularly in cases where memory is addressed in bytes. Likewise incrementing of the forward read pointer or decrementing of the reverse read pointer may correspond to a bitwise change in memory location pointed to, a bytewise change in memory location pointed to, etc., depending upon the size of the coded data extracted with each symbol read operation. Other granularities may also be used, including words, half-words or others.

Using the above-described technique, the length of the streams need not be signaled to the decoder provided the decoder knows or may determine the length of the data unit 200. In one example, the length of the data unit is prescribed at a higher level in a protocol stack. Examples include a network datagram payload length, a file format, an application programming interface (API) definition, or other high level specifications. In another example, the preamble 202 itself is structured to contain a signal indicating the length of the data unit. The length may be explicitly specified in the preamble 202, for example. Alternatively, a code or other index may indicate a data unit type that is associated with a specific data unit length, for example. In yet another example, the preamble 202 may include a synchronization codeword that signals the start of a data unit to the decoder. By finding the next synchronization codeword in a transmitted bitstream the decoder is able to determine the length of the data unit 200.

Figure 3:
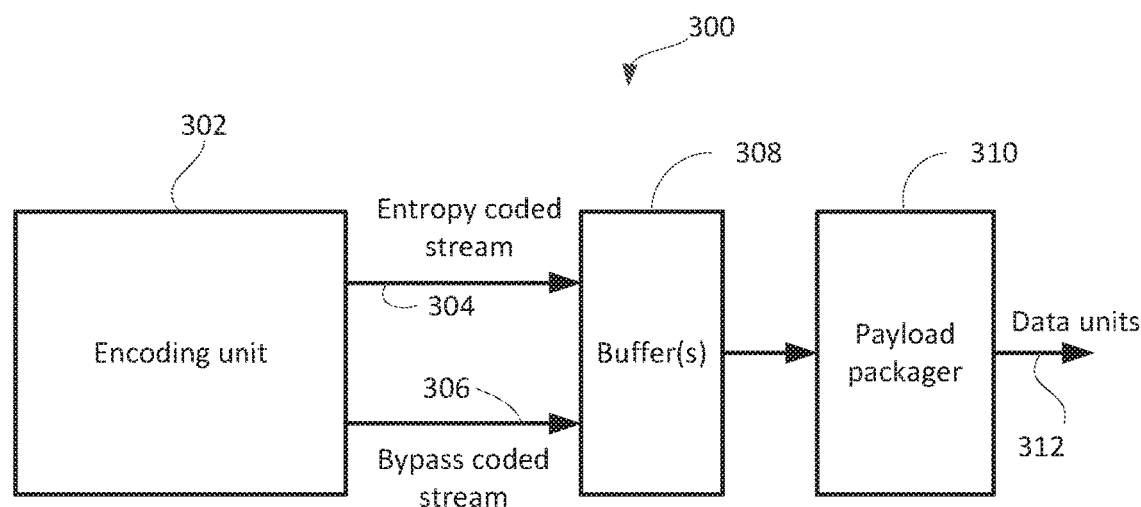
FIG. 3 shows, in block diagram form, one example of an encoder.

Reference is now made to FIG. 3, which illustrates, in block diagram form, one example encoder 300. The encoder 300 includes an encoding unit 302 that generates the two streams: an entropy coded stream 304 and a bypass coded stream 306. In some examples, the encoding unit 302 generates a single bitstream in which entropy coded and bypass coded data is interleaved. In such an embodiment, the encoding unit 302 further includes a demultiplexer to separate the stream into the two streams 304, 306 on the basis of the symbol type.

The term "symbol type", as used herein, refers to whether the symbol is entropy coded or bypass coded. The symbol type may be specified by a context model that prescribes a certain coding mechanism for certain symbols. For example, in the example case of video coding of transform domain coefficients, the context model may prescribe certain context-determination operations for determining a context for entropy coding significant-coefficient flags, greater-than-one flags, and the like. It may further specify that certain symbols, such as sign bits for example, are to be bypass coded, i.e. the probability of such symbols is statically set top=0.5. In some examples, as will be further described below, symbols that are designated to be entropy encoded in a context adaptive system may happen to have a probability that is sufficiently close to equiprobable (p=0.5) that they are re-routed to the bypass coder rather than being entropy coded.

The encoder 300 further includes a buffer 308 to store the entropy coded stream 304 and the bypass coded stream 306. The buffer 308 may include one or more physical memories and/or portions of a physical memory.

The buffer 308 may, in some embodiments, store one of the streams 304, 306 in reverse order. That is, the storing operation may include applying a reversal of the data order to one of the streams 304, 306. As noted above, the reversal may be bitwise, bytewise, or at some other level.

The encoder 300 further includes a payload packager 310. The payload packager 310 may be part of a data transmission unit configured to packetize and package data for transmission in accordance with a selected transmission protocol. The payload packager 310 outputs packaged data in the form of data units 312. The data units 312 are structured as described in FIG. 2; that is, beginning with a preamble, followed by a forward order stream, and ending with a reverse order stream. In this example, the forward order stream may include the entropy coded stream 304 and the reverse order stream may include a reverse copy of the bypass coded stream 306.

If the buffer 308 is configured to store the bypass coded stream 306 in reverse order, then the reverse order stream may be obtained by the payload packager 310 by reading the reverse-stored bypass coded stream 306 from the buffer 308. If the buffer 308 stores the bypass coded stream 306 in its forward coding order, then the payload packager 310 may reverse the bypass coded stream 306 before inserting it into the data unit 312. In one example, this may include reading the bypass coded stream 306 from the buffer 308 in reverse order.

It will also be appreciated that the reverse order stream is to be aligned with the end of the data unit 312. If the data unit 312 is of a prescribed or fixed length, then the payload packager 310 may add buffer bits and/or bytes to ensure the first byte (in coding order) of the bypass coded stream 306 is in the last byte position of the data unit 312. Even if the data unit is not of a prescribed length, the payload packager 310 may be configured to add bits to the end (in coding order) of the entropy coded stream 304 and the bypass coded stream 306 to ensure they are byte aligned in cases where processing is on a bytewise basis. Those padding bits may be discarded by the decoder when it determines that decoding of the streams 304 and 306 has been completed. It will be understood that the decoder, through operation of the decoding process, consumes symbols in accordance with the context-adaptive decoding process being used and, as such, may determine when it has reached the end of a section of coding (e.g. a coding scheme prescribed portion of the data being reconstructed).

The buffer 308 may include more than one buffer/memory in some cases. Because the length of the two streams is generally not known in advance as they are generated by the encoding unit 302, either two buffers are used along with a subsequent concatenation operation, or a single sufficiently large buffer is used and concatenation is performed by moving data within the buffer. For example, the bypass coded stream may be moved to align with the end of the entropy coded stream; alternatively, the preamble and forward entropy coded stream may be moved to align with the start of the reversed bypass coded stream.

In some implementations, the payload packager 310 may have its own output buffer to which it writes data to assemble the data unit 312. In some implementations, the payload packager 310 uses the buffer 308 to assemble the data unit 312 using, for example, the concatenation/reversal operations discussed above.

Figure 4:
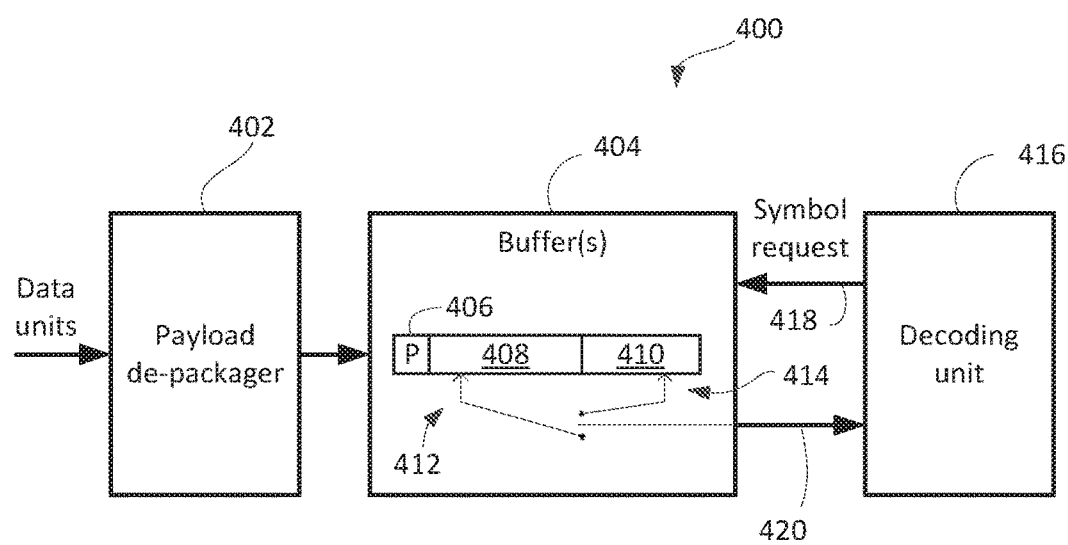
FIG. 4 shows, in block diagram form, one example of a decoder.

Reference will now be made to FIG. 4, which shows, in block diagram form, an example decoder 400. The decoder 400 receives one or more data units structured in accordance with the description above. The decoder 400 includes a payload de-packager 402 that receives a data unit. The payload de-packager 402 may extract the data unit from other encapsulation in some cases, depending upon the transmission protocol. The payload de-packager 402 may store the data unit, or at least the payload, in buffer 404. In some cases, the payload de-packager 402 writes a copy of the data unit to the buffer 404 in forward (transmission) order. In one example, the payload de-packager 402 writes a second copy of the data unit to the buffer 404, but writes it in a reverse order (bitwise, bytewise, or otherwise) such that the beginning of the reverse-stored data unit is the beginning of the (reverse) bypass coded stream aligned with the end of the payload.

In this example, it is presumed that the payload de-packager 402 writes a single copy of the data unit to the buffer 404. As previously noted the data unit includes a preamble 406, a forward order stream 408, and a reverse order stream 410.

The decoder 400 may, in some examples, initialize a forward read pointer 412 at the first bit/byte of the forward order stream 408, and may initialize a reverse read pointer 414 at the first bit/byte/etc. of the reverse order stream 410.

A decoding unit 416 manages the decoding and reconstruction process in accordance with the coding model for the data in question. As the decoding process proceeds, the decoding unit 416 requests 418 a next coded symbol based on the decoding process and the context model being used. The request 418 may indicate a symbol type, i.e. entropy coded or bypass coded. A read operation then occurs to read a portion of data, e.g. a coded symbol(s), from the stored data unit from either the forward order stream 408 or the reverse order stream 410, depending upon the symbol type in the request 418. The read operation extracts the coded symbol(s) from the address indicated by the forward read pointer 412 or the reverse read pointer 414, depending upon the symbol type requested. The forward read pointer 412 or reverse read pointer 414 is then incremented or decremented, respectively.

In an example in which the entropy coded stream is an arithmetically encoded bitstream, i.e. an AEC stream, it will be appreciated that an AEC decoder runs somewhat asynchronously in that a portion of bits from the bitstream does not correspond to a discrete symbol, but instead a certain portion of bits of the bitstream defines the arithmetic coding of successive intervals that, based on contextual probabilities, reflect the coding of a sequence of bins. In that sense, the AEC decoder may consume sequences of bits from the bitstream in decoding a series of arithmetically encoded bins (symbols), which are then made available to the decoding unit 416 in response to the request 418 for a symbol. In such an embodiment, the "incrementing" of the pointer is tied to the consumption of bits of the bitstream by the AEC decoder rather than the output of decoded symbols by the AEC decoder.

Figure 5:
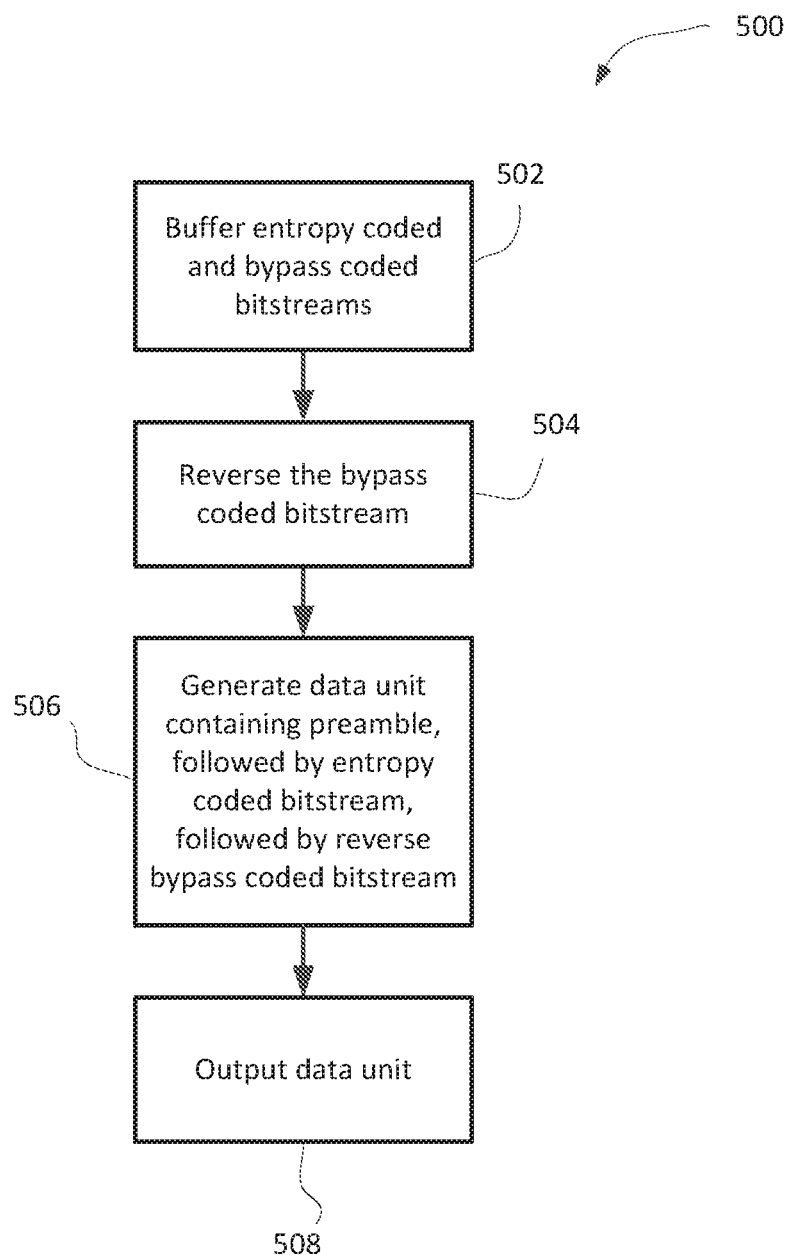
FIG. 5 shows, in flowchart form, one example encoding process.

A flowchart illustrating one example encoding process 500 is shown in FIG. 5. The encoding process 500 presumes the entropy coded stream and bypass coded stream are being generated, and, if applicable, de-multiplexed from an integrated stream. The process 500 begins with buffering at least a portion of the entropy coded stream and the bypass coded stream as it is being generated in operation 502. The bypass coded stream, in this example, is reversed in operation 504. As noted above, in some cases this reversal may occur when storing the bypass coded stream in the buffer in operation 502. In some cases, this reversal may occur after the storing. In some cases, the reversal operation 504 occurs by reading and re-writing the bypass coded stream to the buffer in reverse order. In some cases, the reversal operation 504 occurs when generating the payload by reading the bypass coded stream from the buffer in reverse order.

In operation 506, the encoder generates the data unit with a preamble followed by the forward order stream, which is followed by the reverse order bypass coded stream. The beginning, in coding order, of the bypass coded stream is aligned with the end of the data unit.

The data unit is then output in operation 508.

Figure 6:
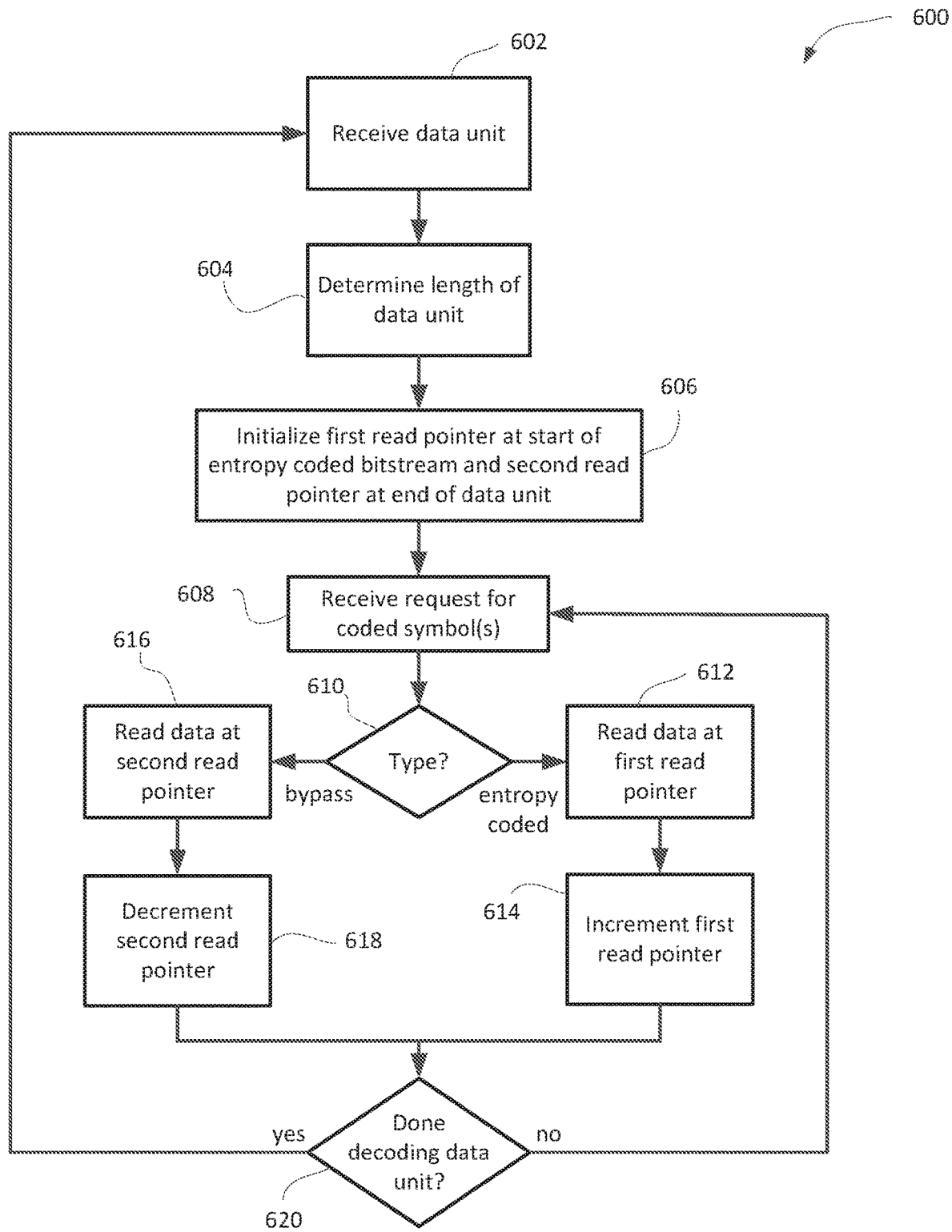
FIG. 6 shows, in flowchart form, one example decoding process.

An example decoding process 600 is illustrated by way of flowchart in FIG. 6. The decoding process 600 includes, in operation 602, receiving a data unit having the structure discussed above. That is, the data unit includes a preamble and a payload. The payload includes an entropy coded stream and a bypass coded stream. One of the streams is in forward order and appears in the data unit immediately after the preamble, and the other stream is in reverse order and is aligned with the end of the data unit. There may or may not be data, such as bit padding or other data, between the two streams in the payload. For the purposes of this example, the bypass coded stream is presumed to be the reverse order stream.

The decoder determines the length of the data unit in operation 604. As noted above, the length of the data unit may be prescribed by the transmission type, the coding protocol, higher level header information, or some other external source. In some cases, the length of the data unit may be specified explicitly or implicitly in the preamble. In some cases, the length of the data unit may be signaled by way of a synchronization codeword in each preamble, such that the decoder determines the length of a data unit by finding the next synchronization codeword in an incoming bitstream of data.

The data unit is stored in memory in the decoder. In operation 606, the decoder initializes a first read pointer at the start of the entropy coded stream and initializes a second read pointer at the start, in a coding order sense, of the bypass coded stream, i.e. at the end of the data unit. In operation 608, a request for a coded symbol is generated. The request is driven by a decoding process that decodes and reconstructs symbols from the data units as part of a decoding and data reconstruction process. Example processes include audio coding, video coding, multimedia coding, point cloud coding, or other data compression processes.

The symbol type associated with the request is determined in operation 610. That is, the request is either for a bypass coded symbol or an entropy coded symbol. If the requested symbol is entropy coded, then in operation 612, data is read from the forward order stream, i.e. that portion of the entropy coded stream pointed to by the first read pointer. The first read pointer is then incremented in operation 614. Conversely, if the requested symbol is bypass coded, then in operation 616, data is read from the reverse order stream, i.e. that portion of the bypass coded stream pointed to by the second read pointer. The second read pointer is then decremented in operation 618. The decoder passes the extracted coded symbol to an entropy decoder or a bypass decoder, as the case may be.

It will be appreciated that in some embodiments the decoder may store a second copy of the data unit in memory in reverse order. In that case, the second read pointer is initialized to point to the beginning of the reverse order data unit, and the second read pointer is incremented as bypass coded symbols are read.

In operation 620 the decoder evaluates whether it has finished decoding the bypass coded stream and the entropy encoded stream. If not, then it returns to operation 608 to evaluate the next symbol request. If so, then it moves to the next data unit in operation 602.

It will be appreciated that it is not possible to determine the end of the streams without decoding the entirety of one of the streams. Accordingly, the operation of the entropy decoder, e.g. an arithmetic decoder, does not rely on bounded bitstream reads to discard trailing bits from the stream. A bounded read operation is one that after reading a pre-defined number of bits, returns a pre-defined constant value. In other words, the entropy encoded stream must be completely self-contained.

As discussed above, byte-wise addressing is common in many systems, which may lead to byte-wise handing of the coded data, including byte-wise reversal of one of the coded streams. In order to avoid a pointer dereference after each extraction of eight bypass symbols, some systems may copy the current sub-stream byte to an intermediate variable. Using a multi-byte intermediate variable to increase efficiency can be facilitated by appropriate bit ordering of the constituent bits of each byte of the reversed bypass sub-stream.

To enable multi-byte operation in the case of an architecture that uses a little-endian data model, the bits in each byte may be ordered such that the most significant bit in a given byte is the first bit to be unpacked in that byte, and the least significant bit in a given byte is the last bit to be unpacked in that byte. For a sequence of bits a . . . x, where bit a is the first bit to be decoded, and x the last, the resulting sub-stream construction may be illustrated as follows:

| | MSB | | | bit position | | | | LSB |
|---|---|---|---|---|---|---|---|---|
| data[pos] | b7 | b6 | b5 | b4 | b3 | b2 | b1 | b0 |
| N-3 | q | r | s | t | u | v | w | x |
| N-2 | i | j | k | l | m | n | o | p |
| N-1 | a | b | c | d | e | f | g | h |

On a little-endian architecture, reading the 3-byte word at address N−3 results in the binary word abcdefghijklmnopqrstuvwx$_b$. This property is extensible to any machine word size. A variable L may be used to track the current bit-level read (or write) position of the current word.

One method to extract a single bit V from the Q-bit sized word W is to maintain the MSB of W as the next unread bit:

```
1.   if ( L = = 0 ) {           ; If no bits available
2.       W = *data_ptr- -       ; Load next Q-bit word, advancing
                                  pointer
3.       L = Q                  ; Reset read position
     }
4.   V = ( W >> ( Q − 1 ) ) & ; Extract the MSB of W as V
     1
5.   L = L − 1                  ; Advance read position
```

Figure 7:
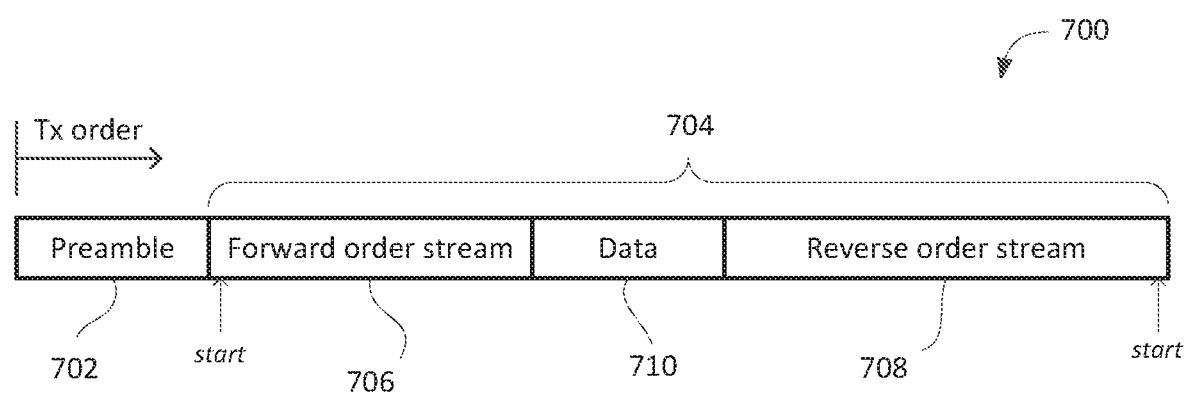
FIG. 7 diagrammatically illustrates the structure of another example data unit.

Reference is now made to FIG. 7, which diagrammatically shows a structure of another example data unit 700. In this example, the data unit 700 includes a preamble 702 and a payload 704, and the payload 704 includes a forward order stream 706 and a reverse order stream 708, as described above. However, between the forward order stream 706 and the reverse order stream 708, the payload 704 includes additional data 710. Advantageously, as the decoder decodes the two streams 706 and 708 it discovers their respective lengths, and is able to then extract the data 710 stored between them.

One example use for the additional data 710 is non-decoded stuffing data. When the data unit is parsed according to a given syntax or grammar, no attempt is made to interpret the additional data. Encoders may make use of this property to simplify the flushing operations (potentially flushing more data than necessary), or use the additional data 710 to insert hidden markers that may be used to identify a bitstream, or alternatively use the stuffing data to meet minimum bitrate requirements.

In another example implementation, the additional data 710 may be substantive. In one example, if after decoding the streams 706, 708, the two bitstream pointers forming the decoder state do not point to adjacent bytes then additional data 710 is present and is parsed by the decoder. The additional data 710 may be conveyed in either forward or reversed order. The exact choice of order may depend upon the expected use of the surrounding streams 706, 708. For example, if one stream is known to terminate before the other, then the order of that stream may be used. In certain constructions, the order may depend on whether the reversed order provides more efficient stream access for a decoder.

The additional data 710 may be entropy coded data, bypass coded data, or other data. In one example, the data 710 is another pair of forward order and reverse order bitstreams, such that the data unit 700 contains recursively nested pairs of entropy coded and bypass coded stream pairs. The additional data 710 may or may not include a further preamble.

In order to parse the additional data 710 when present, in one embodiment the decoder read pointers are advanced to skip any bits inserted into the respective stream for the purpose of flushing or byte-alignment, effectively discarding any partial bits from the decoder buffers. An alternative embodiment may elide the flushing or byte-alignment of the first corresponding stream and instead require byte-alignment and flushing of the subsequent stream (although re-initialization of a subsequent AEC stream may nevertheless need to occur). In such a system, an encoder will flush or byte-align the streams if no additional data 710 is to be contained in the data unit 700.

The preamble may contain a flag signaling whether additional data 710 is present in the bitstream. In some implementations, the flag may indicate a formal restriction on the bitstream construction to ensure the absence of any stuffing data. For example, after all parsable data in the data unit is parsed, the decoder confirms that the two bitstream pointers forming the decoder state point to adjacent bytes. Unless a flag signaled earlier in the bitstream (for instance in the preamble) to indicate that additional data 710 is present, the two bitstream points must point to adjacent bytes or an error is detected.

In many of the examples above, the entropy coder generated the entropy coded stream and the bypass coded stream based on a symbol type prescribed by a coding model. That is, the coding process indicates, perhaps due to symbol type, whether a particular symbol is to be context-adaptively entropy coded, or whether the symbol has a static probability of p=0.5 and is to be bypass coded in all cases. However, in some context-adaptive coding processes, it may occur that a context evolves such that the associated probability approaches p=0.5, depending upon statistics of the underlying data. In such a case, it may be beneficial to force such symbols to the bypass coder rather than using the entropy coder, despite the fact that they are supposed to be entropy coded according to the context model.

For a symbol with an associated adaptive probability model an example process may include The current symbol probability, prob0, is inspected and the difference between it and the equiprobable probability (e.g., 0.5 for binary symbols) is tested against a threshold. An example threshold may be less than 0.05 or less than 0.03, for instance.

If the difference is less than the threshold, the symbol is processed as an ordinary bypass symbol. Otherwise, it is processed by an entropy coder, such as an arithmetic codec. In both cases, the symbol probability model (i.e., the next value of prob0) is updated according to the symbol value, the current symbol probability, and an update function as per usual in the context adaptive coding scheme.

Figure 8:
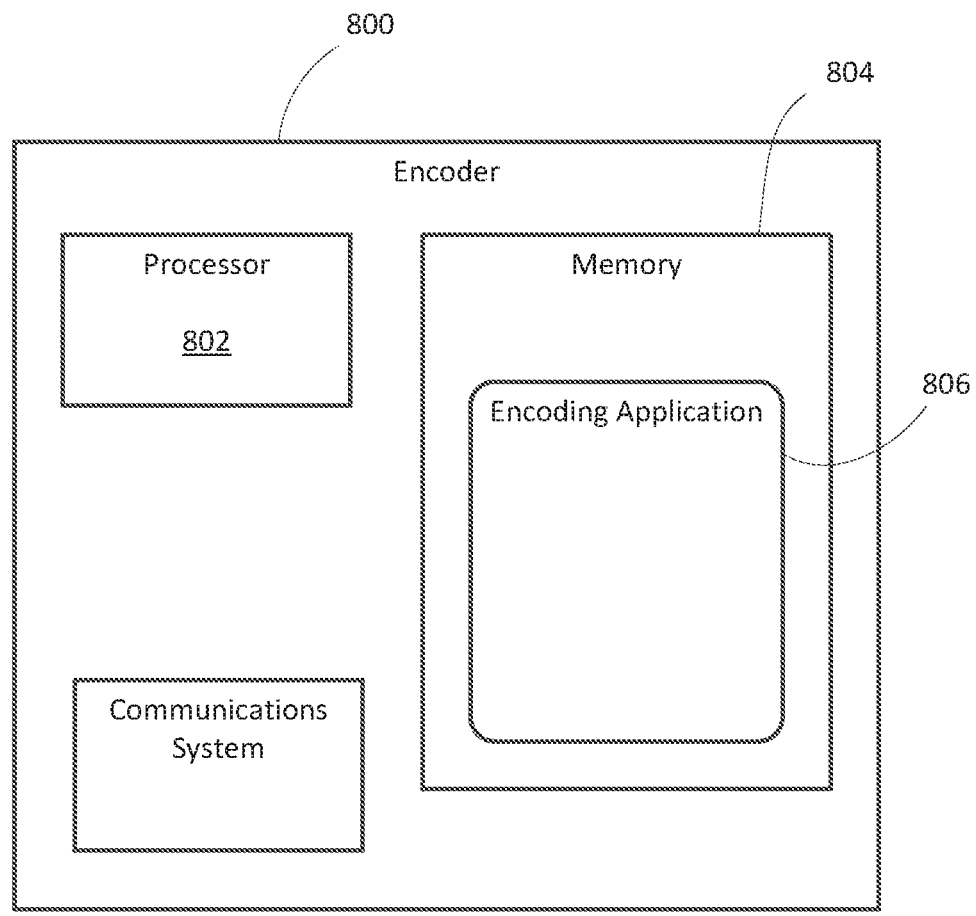
FIG. 8 shows a simplified block diagram of an example embodiment of an encoder.

Reference is now made to FIG. 8, which shows a simplified block diagram of an example embodiment of an encoder 800. The encoder 800 includes a processor 802, memory 804, and an encoding application 806. The encoding application 806 may include a computer program or application stored in memory 804 and containing instructions that, when executed, cause the processor 802 to perform operations such as those described herein. For example, the encoding application 806 may encode and output data units in accordance with the processes described herein. It will be understood that the encoding application 806 may be stored on a non-transitory computer-readable medium, such as a compact disc, flash memory device, random access memory, hard drive, etc. When the instructions are executed, the processor 802 carries out the operations and functions specified in the instructions so as to operate as a special-purpose processor that implements the described process(es). Such a processor may be referred to as a "processor circuit" or "processor circuitry" in some examples.

Figure 9:
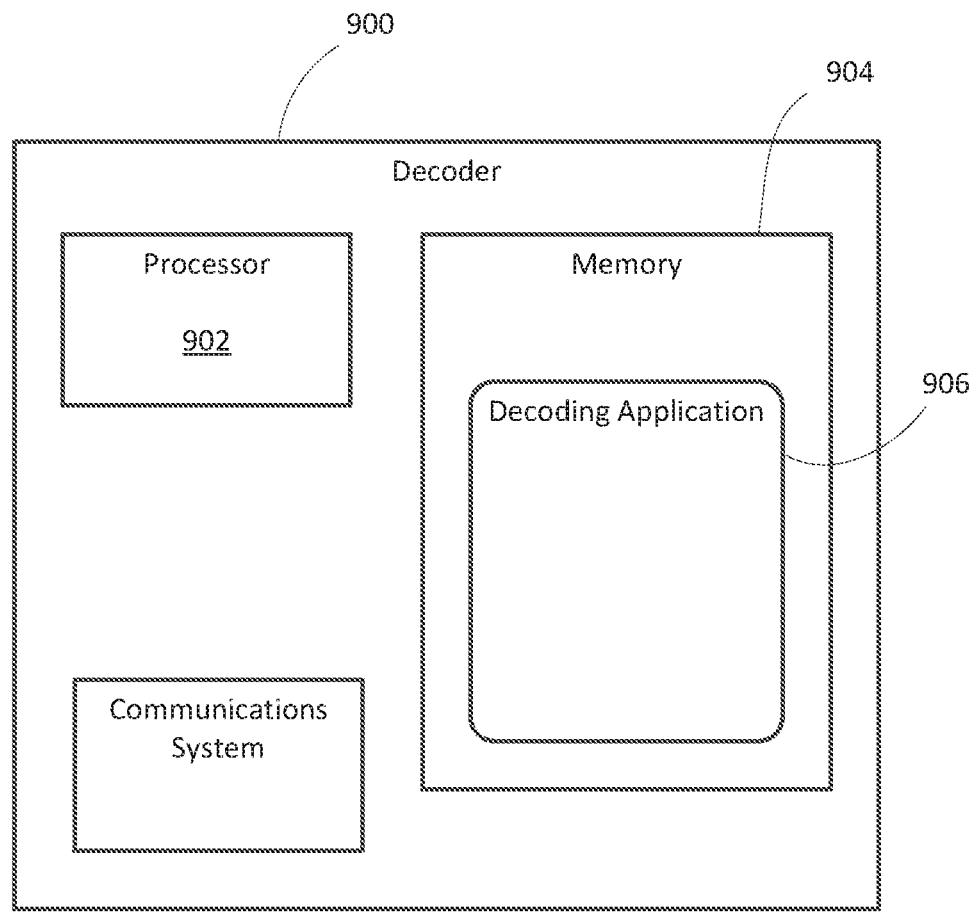
FIG. 9 shows a simplified block diagram of an example embodiment of a decoder.

Reference is now also made to FIG. 9, which shows a simplified block diagram of an example embodiment of a decoder 900. The decoder 900 includes a processor 902, a memory 904, and a decoding application 906. The decoding application 906 may include a computer program or application stored in memory 904 and containing instructions that, when executed, cause the processor 902 to perform operations such as those described herein. It will be understood that the decoding application 906 may be stored on a computer-readable medium, such as a compact disc, flash memory device, random access memory, hard drive, etc. When the instructions are executed, the processor 902 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of decoding a data unit to reconstruct encoded data, the method comprising:
receiving the data unit, which includes a preamble followed by a payload, the payload including a forward order bitstream followed by a reverse order bitstream;
determining a length of the data unit;
in response to a request for a symbol from a decoding unit, selectively reading data from either the forward order bitstream in a forward order or the reverse order bitstream in a reverse order; and
decoding the data in the decoding unit to reconstruct the symbol,
wherein one of the forward order bitstream and the reverse order bitstream includes entropy encoded symbols and the other of the forward order bitstream and the reverse order bitstream includes bypass coded symbols.

2. The method of claim 1, wherein the request for a symbol indicates whether a symbol type is entropy coded or bypass coded, and wherein the selectively reading data of the forward order bitstream or the reverse order bitstream is based on the symbol type.

3. The method of claim 1, wherein the method further includes initializing a forward read pointer at a beginning of the forward bitstream after the preamble, and initializing a reverse read pointer at the end of the data unit.

4. The method of claim 3, wherein reading data from the forward order bitstream includes reading the data indicated by the forward read pointer and then incrementing the forward read pointer, and wherein reading data from the reverse order bitstream includes reading the data indicated by the reverse read pointer and then decrementing the reverse read pointer.

5. The method of claim 4, wherein the data has a size of one or more bytes, and wherein the incrementing and decrementing of the pointers is by the size.

6. The method of claim 1, wherein selectively reading data from the reverse order bitstream in a reverse order includes storing a copy of the data unit in memory in reverse order and reading the reverse order data unit in forward order starting from the beginning of the reverse order data unit.

7. The method of claim 1, wherein determining the length of the data unit includes one of:
detecting an end of the data unit based on a synchronization codeword;
reading a length value from the preamble; or
obtaining a data unit length from higher level metadata.

8. The method of claim 1, further including determining that decoding of the forward order bitstream and the reverse order bitstream is complete, and discarding any bits present for byte-alignment.

9. The method of claim 8, further includes decoding additional data positioned between the forward order bitstream and the reverse order bitstream in the data unit.

10. A method of transmitting encoded data, where the encoded data includes a first bitstream of entropy encoded symbols and a second bitstream of bypass coded symbols, the method comprising:
buffering the first bitstream and the second bitstream;
reversing one of the first bitstream and the second bitstream to create a reverse order bitstream, wherein the other of the first bitstream and the second bitstream is a forward order bitstream;
generating a data unit that includes a preamble followed by the forward order bitstream, which is followed by the reverse order bitstream; and
outputting the data unit.

11. A decoder to reconstruct encoded data from a data unit, the decoder comprising:
at least one processor;
memory; and a decoding application that contains processor-executable instructions that, when executed by the at least one processor, cause the decoder to:
  receive the data unit, which includes a preamble followed by a payload, the payload including a forward order bitstream followed by a reverse order bitstream;
  determine a length of the data unit;
  in response to a request for a symbol from a decoding unit, selectively read data from either the forward order bitstream in a forward order or the reverse order bitstream in a reverse order; and
  decode the data in the decoding unit to reconstruct the symbol,
  wherein one of the forward order bitstream and the reverse order bitstream includes entropy encoded symbols and the other of the forward order bitstream and the reverse order bitstream includes bypass coded symbols.

12. The decoder of claim 11, wherein the request for a symbol indicates whether a symbol type is entropy coded or bypass coded, and wherein the selectively reading data of the forward order bitstream or the reverse order bitstream is based on the symbol type.

13. The decoder of claim 11, wherein the processor-executable instructions, when executed, further cause the decoder to initialize a forward read pointer at a beginning of the forward order bitstream after the preamble, and initialize a reverse read pointer at the end of the data unit.

14. The decoder of claim 13, wherein the processor-executable instructions, when executed, cause the decoder to read data from the forward order bitstream by reading the data indicated by the forward read pointer and then incrementing the forward read pointer, and wherein the processor-executable instructions, when executed, cause the decoder to read data from the reverse order bitstream by reading the data indicated by the reverse read pointer and then decrementing the reverse read pointer.

15. The decoder of claim 14, wherein the data has a size of one or more bytes, and wherein the incrementing and decrementing of the pointers is by the size.

16. The decoder of claim 11, wherein the processor-executable instructions, when executed, cause the decoder to selectively read data from the reverse order bitstream in a reverse order by storing a copy of the data unit in memory in reverse order and reading the reverse order data unit in forward order starting from the beginning of the reverse order data unit.

17. The decoder of claim 11, wherein the processor-executable instructions, when executed, cause the decoder to determine the length of the data unit by one of:
  detecting an end of the data unit based on a synchronization codeword;
  reading a length value from the preamble; or
  obtaining a data unit length from higher level metadata.

18. The decoder of claim 11, wherein the processor-executable instructions, when executed, further cause the decoder to determine that decoding of the forward order bitstream and the reverse order bitstream is complete, and discard any bits present for byte-alignment.

19. The decoder of claim 18, wherein the processor-executable instructions, when executed, further cause the decoder to decode additional data positioned between the forward order bitstream and the reverse order bitstream in the data unit.

20. An encoder to transmitting encoded data encoded data where the encoded data includes a first bitstream of entropy encoded symbols and a second bitstream of bypass coded symbols, the encoder comprising:
  at least one processor;
  memory; and
  an encoding application that contains processor-executable instructions that, when executed by the at least one processor, cause the encoder to:
    buffer the first bitstream and the second bitstream;
    reverse one of the first bitstream and the second bitstream to create a reverse order bitstream, wherein the other of the first bitstream and the second bitstream is a forward order bitstream;
    generate a data unit that includes a preamble followed by the forward order bitstream, which is followed by the reverse order bitstream; and
    output the data unit.

* * * * *